(12) United States Patent
Tronel et al.

(10) Patent No.: US 12,413,004 B2
(45) Date of Patent: Sep. 9, 2025

(54) PISTON ASSEMBLY AND SPRING-LOADED CONTACT

(71) Applicant: PRECI-DIP SA, Delémont (CH)

(72) Inventors: Tanguy Tronel, Delémont (CH); Didier Guelat, Delémont (CH)

(73) Assignee: PRECI-DIP SA, Delemont (CH)

( * ) Notice: Subject to any disclaimer, the term of this patent is extended or adjusted under 35 U.S.C. 154(b) by 535 days.

(21) Appl. No.: 17/725,484

(22) Filed: Apr. 20, 2022

(65) Prior Publication Data
US 2022/0336988 A1    Oct. 20, 2022

Related U.S. Application Data

(60) Provisional application No. 63/282,674, filed on Nov. 23, 2021.

(30) Foreign Application Priority Data

Apr. 20, 2021  (EP) ..................... 21169349

(51) Int. Cl.
*H01R 13/24* (2006.01)
*H01R 12/71* (2011.01)
*H05K 7/10* (2006.01)

(52) U.S. Cl.
CPC ....... *H01R 13/2421* (2013.01); *H01R 12/714* (2013.01); *H05K 7/1069* (2013.01)

(58) Field of Classification Search
CPC .. H01R 13/2421; H01R 12/714; H01R 13/08; H01R 4/02; H05K 7/1069
See application file for complete search history.

(56) References Cited

U.S. PATENT DOCUMENTS

| | | | | |
|---|---|---|---|---|
| 4,948,377 A | * | 8/1990 | Cairns .................. | H01R 13/523 439/271 |
| 5,032,787 A | * | 7/1991 | Johnston ............ | H01R 13/2421 324/755.05 |
| 5,194,012 A | * | 3/1993 | Cairns .................. | H01R 13/523 439/271 |
| 5,641,315 A | * | 6/1997 | Swart ................. | G01R 1/06722 324/755.05 |

(Continued)

FOREIGN PATENT DOCUMENTS

EP    0838878 A1    4/1998
EP    3764476 A1    1/2021

OTHER PUBLICATIONS

Foreign Communication from a Related Counterpart Application, Extended European Search Report and Written Opinion dated Sep. 28, 2021, European Application No. 21169349.4 filed on Apr. 20, 2021.

*Primary Examiner* — Abdullah A Riyami
*Assistant Examiner* — Nelson R. Burgos-Guntin
(74) *Attorney, Agent, or Firm* — Conley Rose, P.C.

(57) ABSTRACT

A piston assembly for a spring-loaded contact, comprising a piston body, arranged to be received into a guiding cylinder of the spring loaded contact, a piston head, with a contacting surface arranged for contacting an external part, a clip arranged to mate with a conductive portion of the spring loaded contact, wherein the piston body comprises a through hole, the clip being arranged into the through hole, and wherein the piston head is attached to the piston body by an ultrasonic welded portion.

12 Claims, 3 Drawing Sheets

(56) References Cited

U.S. PATENT DOCUMENTS

| | | | | |
|---|---|---|---|---|
| 6,017,227 A * | 1/2000 | Cairns | G02B 6/3816 | 439/138 |
| 6,095,838 A * | 8/2000 | Brickett | H01R 13/523 | 439/201 |
| 6,220,870 B1 * | 4/2001 | Barabi | H01R 13/2485 | 439/71 |
| 6,332,787 B1 * | 12/2001 | Barlow | H01R 13/5227 | 439/138 |
| 6,861,862 B1 * | 3/2005 | Tate | G01R 1/0483 | 439/700 |
| 7,544,093 B2 * | 6/2009 | Soubh | H01R 13/6599 | 439/581 |
| 7,695,301 B2 * | 4/2010 | Mudge, III | H01R 13/533 | 439/732 |
| 7,922,529 B1 * | 4/2011 | Meurer | H01R 13/2421 | 439/700 |
| 9,331,400 B1 * | 5/2016 | Bianca | H01R 13/03 | |
| 10,505,293 B2 * | 12/2019 | Wagner | H01R 13/512 | |
| 10,700,454 B1 * | 6/2020 | Blackburn | H01R 11/28 | |
| 2003/0006787 A1 * | 1/2003 | Kazama | G01R 1/06716 | 324/755.05 |
| 2007/0034416 A1 * | 2/2007 | Cho | B23K 20/02 | 175/434 |
| 2011/0102009 A1 * | 5/2011 | Lee | G01R 1/0491 | 29/877 |
| 2012/0028489 A1 * | 2/2012 | Gramsamer | H01R 13/521 | 439/271 |
| 2012/0214346 A1 * | 8/2012 | Leroyer | H01R 13/2421 | 439/625 |
| 2013/0095707 A1 * | 4/2013 | Kim | H01R 13/08 | 439/840 |
| 2014/0127926 A1 * | 5/2014 | Condo | H01R 13/6456 | 439/345 |
| 2014/0162504 A1 * | 6/2014 | Tran | G01R 3/00 | 439/788 |
| 2014/0367210 A1 * | 12/2014 | Nielsen | F03D 7/0244 | 188/151 R |
| 2015/0270635 A1 * | 9/2015 | Wollitzer | H01R 24/50 | 439/675 |
| 2018/0166809 A1 * | 6/2018 | Brogan | H01R 13/2407 | |
| 2018/0236758 A1 * | 8/2018 | Burgold | B33Y 80/00 | |
| 2018/0323529 A1 * | 11/2018 | Gruber | H01R 13/2421 | |
| 2018/0366844 A1 * | 12/2018 | Beganovic | H01R 9/0515 | |
| 2020/0099163 A1 * | 3/2020 | Tziviskos | H01F 7/02 | |
| 2020/0208590 A1 * | 7/2020 | Zhang | F02F 3/22 | |
| 2020/0253639 A1 * | 8/2020 | Kim | A61B 17/29 | |
| 2020/0381858 A1 * | 12/2020 | Brennan | H01R 12/712 | |
| 2022/0336988 A1 * | 10/2022 | Tronel | H01R 12/714 | |

* cited by examiner

PISTON ASSEMBLY AND SPRING-LOADED CONTACT

CROSS-REFERENCE TO RELATED APPLICATIONS

The present application claims priority to U.S. Provisional Application No. 63/282,674 filed with the United States Patent and Trademark Office on Nov. 23, 2021 and entitled "PISTON ASSEMBLY AND SPRING-LOADED CONTACT," and also claims priority to European Application No. 21169349.4 filed with the European Patent Office on Apr. 20, 2021 and entitled "PISTON ASSEMBLY AND SPRING-LOADED CONTACT," both are incorporated herein by reference in their entirety for all purposes.

DESCRIPTION

The present invention relates to a piston assembly and a spring-loaded contact.

In a spring-loaded connector which has a tubular housing hosting spring loaded piston with a clip accommodated therein with a plurality of beams, it would be conceived that the clip is inserted into the tubular housing by pushing the beams of the clip. However, this process may damage the beams and reduce a reliability of the connector.

In addition, providing a piston assembly to allow insertion of the clip by pushing it via an end face opposite to the beams requires increased wall thickness to achieve the require press fit resistance. Such increase of thickness leads to an in*crease of the pitch in a plug having several spring-loaded connectors.

An object of the invention is to provide a reliable compact piston assembly and a spring-loaded contact including the same.

In the above aim, a first aspect of the invention is a piston assembly for a spring-loaded contact, comprising:
  a piston body, arranged to be received into a guiding cylinder of the spring loaded contact,
  a piston head, with a contacting surface arranged for contacting an external part,
  a clip arranged to mate with a conductive portion of the spring loaded contact,
    wherein the piston body comprises a through hole, the clip being arranged into the through hole,
    and wherein the piston head is attached to the piston body by an ultrasonic welded portion.

According to the above structure, as the piston assembly is made of separate parts (a piston body and a piston head) and the piston head is configured to be attached to the piston body, the clip can be inserted into the through hole of the piston body from the piston head side, so that clip is not damaged during assembling. In addition, the piston head is ultrasonically welded to the piston body, thus the thickness of the piston assembly can be reduced with still providing enough strength.

Advantageously, the clip comprises:
  a flexible contacting end arranged to mate with the conductive portion of the spring-loaded contact,
  a base end, opposite to the flexible contacting end, wherein the base end is located in the through hole on a piston head side.

According to this structure, damage of the flexible contacting end is prevented when pushing the base end to insert the clip into the though hole from the piston head side.

Advantageously, the base end comprises a tubular wall arranged to withstand a press fit force applied to the clip to insert the clip into the through hole.

Advantageously, the piston head provides an abutment to the clip. According to this structure, the clip is axially supported by the piston head.

Advantageously, the clip comprises a clipping portion opposite to the piston head.

Advantageously, at least one of the piston body, the piston head and the clip is plated before the piston head is ultrasonically welded to the piston body. One embodiment of the invention is applicable to such plated parts.

Advantageously, the welded portion is free of Heat Affected Zone, or wherein the welded portion is comprising a Heat Affected Zone having a thickness lower than 0.01 mm.

Advantageously, a wall thickness at a position where the piston body and the piston head is welded is less than 0.2 mm. Ultrasonic welding of the present embodiment can achieve this compact structure.

Advantageously, a mating length along a longitudinal axis of the piston assembly at a position where the piston head is mating with the piston body is less than 0.5 mm. Ultrasonic welding of the present embodiment can also achieve this compact structure.

Other aspect of the inventions is a spring-loaded contact, comprising;
  the piston assembly mentioned above, and
  a housing.

Advantageously, the conductive portion comprises a pin portion for mating with the clip. According to this structure, the pin portion can be securely held by the clip.

Advantageously, the conductive portion comprises a base portion for connecting an electronic or electric circuit.

Other features and advantages of the present invention will appear more clearly from the following detailed description of particular non-limitative examples of the invention, illustrated by the appended drawings where:

It is of course understood that obvious improvements and/or modifications for one skilled in the art may be implemented, still being under the scope of the invention as it is defined by the appended claims.

Figure 1:
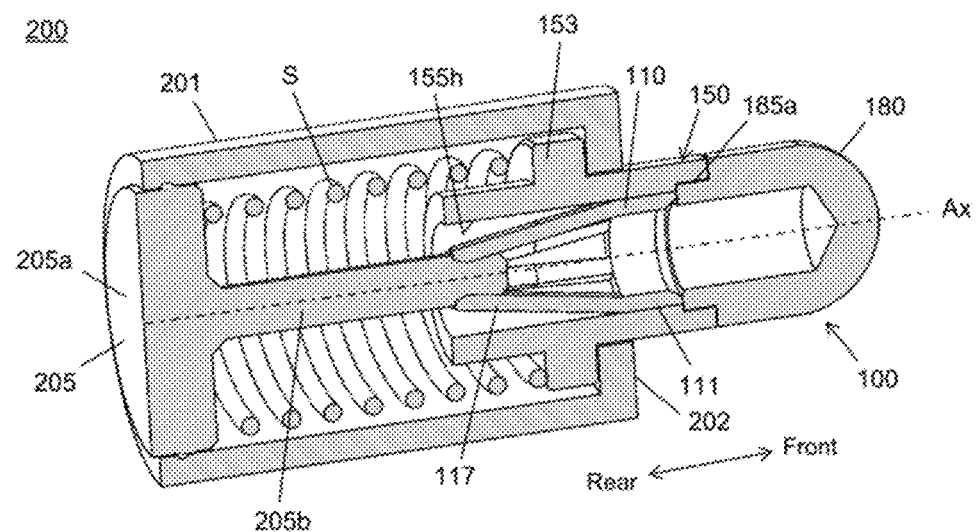
FIG. 1 represents a cross-sectional perspective view of a spring-loaded contact including a piston assembly.

FIG. 1 depicts one embodiment of a spring-loaded contact according to the invention and FIGS. 2 to 6 depict a piston assembly used in the spring-loaded contact.

The spring-loaded contact 200 has a cylindrical housing (guiding cylinder) 201 and a piston assembly 100 in the form of a short rod, comprising a clip 110, accommodated in the housing 201. The housing 201, piston assembly 100 and clip 110 may be designed to align concentrically with each other. The piston assembly 100 is configured to be movable in an axial direction Ax of the housing 201. In the housing 201 a coil spring S and a conductive rod 205 are disposed whose configurations and functions will be described later.

Figure 2:
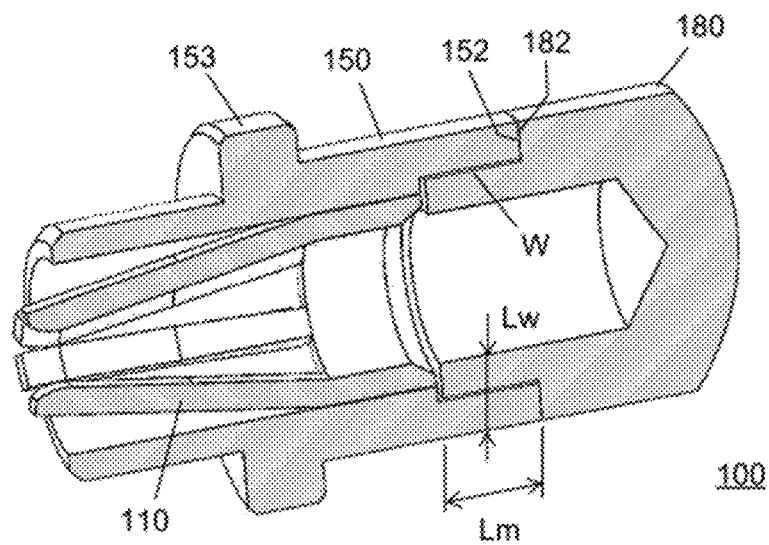
FIG. 2 represents a cross-sectional perspective view of the piston assembly similar to that of FIG. 1.
Figure 3:
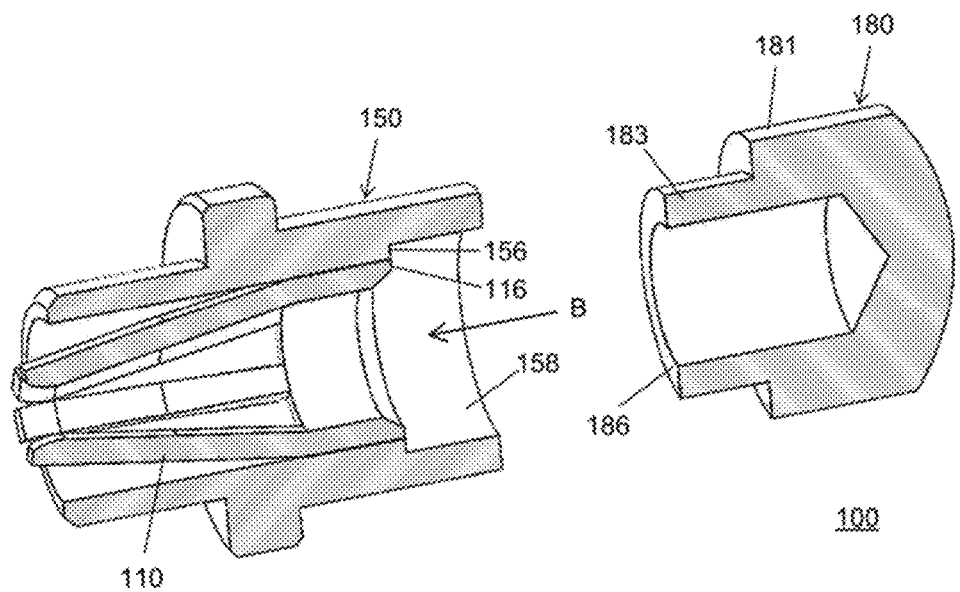
FIG. 3 represents a cross-sectional perspective view of the piston assembly of FIG. 2, before a final assembly step.
Figure 4:
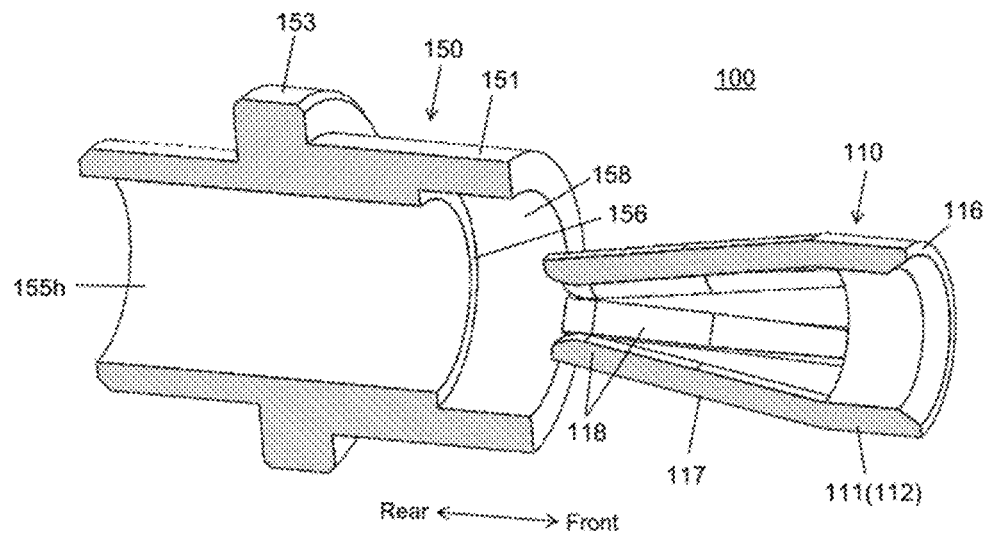
FIG. 4 represents a cross-sectional perspective view of a piston body and a clip of the piston assembly of FIG. 2.
Figure 5:
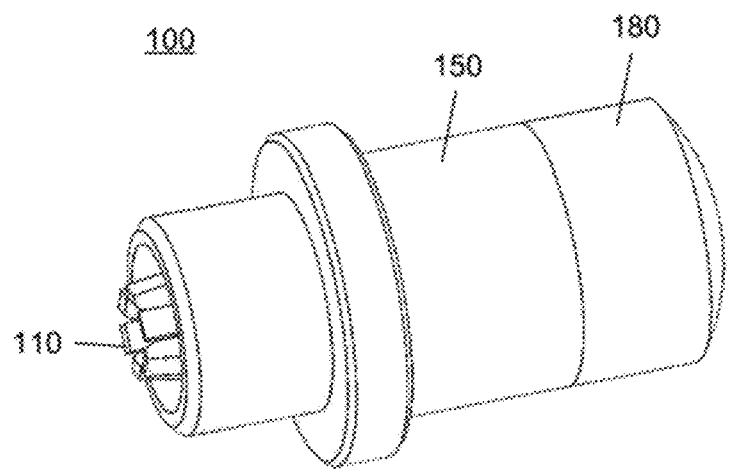
FIG. 5 represents a perspective view of the piston assembly of the piston assembly of FIG. 2.
Figure 6:
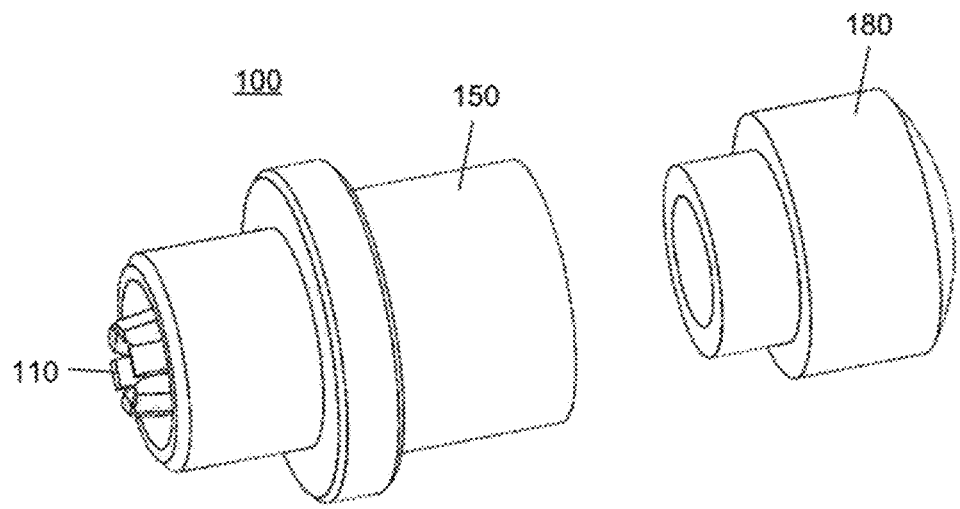
FIG. 6 represents a perspective view of the piston assembly of FIG. 3.

The piston assembly 100 has a tubular piston body 150 and a cap-shaped piston head 180 attached to the end of the piston body 150 as can be seen in FIGS. 2 to 4. The clip 110 is inserted into the inside of the piston body 150. An insertion direction is depicted with a reference character "B" in FIG. 3.

The piston body 150 and the piston head 180 can be typically machined from brass, phosphour-bronze, beryllium-copper or other copper alloy or other conductive metals/alloys, including nickel-silver alloys. The clip 110 can be manufactured from a copper alloy, typically beryllium-copper or other high strength conductive copper alloy. The parts are typically post-plated with any one of a variety of coatings, typically a gold plating, for the purpose of enhancing electrical contact and improving wear and corrosion resistance before the piston head 180 is attached to the piston body 150.

It is noted that the shape of piston body 150 in FIG. 1 and the shape in FIGS. 2 to 6 are different, but they are not essential difference in the invention and the both embodiments can be used The piston body 150 in FIG. 4 is provided with a tubular wall 151 having a through hole 155h and a flange 153 formed on the outer surface of the tubular wall 151. The flange 153 has a greater diameter than the diameter of tubular wall 151. In the embodiment of FIG. 1, the tubular wall has a constant diameter at both sides of the flange 153. By contrast, in the embodiment of FIGS. 2 to 6, the tubular wall 151 has a greater diameter in a front portion and a smaller diameter in a rear portion.

Inside of the piston body 150, a receiving portion 158 is formed into which a tubular part 183 of the piston head 180 is inserted along the insert direction B. The receiving portion 158 is a cylinder-shaped space which may has a constant inner diameter greater than that of the though hole 155h, however, in alternative embodiments, the piston body 150 might have a constant diameter through-hole. The piston body 150 further comprises an annular face 156 extending in radial direction at the end of the receiving portion 158.

As shown in FIG. 1, the piston assembly 100 is disposed in the housing 201 such that the flange 153 is positioned within the housing 201 and a front part of the piston assembly 100 is protruding from an end wall 202 of the housing 201. The flange 153 is pushed by way of the coil spring S so that the flange 153 abuts inside of the end wall 202. The piston assembly 100 can be pushed into the housing 201 as the coil spring S is compressed when it contacts an external component (not shown).

The piston head 180 has a cylindrical body 181 (FIG. 3) which may have a rounded contact end. The cylindrical body 181 includes a tubular part 183 with an end annular face 186. Outer diameter of the tubular part 183 is substantially identical to the inner diameter of the receiving portions 158 of the piston body 150 so that the surfaces can be welded to each other.

Referring to FIG. 4, the clip 110 has a base end 111 in the form of tubular wall 112 and a clipping portion 117 positioned opposite to the piston head 180. The base end 111 is provided with an end face 116. The base end 111 may has an outer diameter substantially identical to the inner diameter of the though hole 155h so that the clip 110 can be pushed and inserted into the through hole 155h (press fit assembly). The clipping portion 117 comprises a plurality of flexible beams 118 in a form of cantilever extending form the base end 111. As each beam 118 is slightly bent radially inwardly, the diameter of the clipping portion 117 is becoming smaller toward the tip end.

As shown in FIG. 1, the clipping portion 117 can hold the end of the conductive rod 205. In particular, the conductive rod 205 has a circular base end 205a and a pin portion 205b extending vertically form the inner surface of the base end 205a. The clipping portion 117 is configured to support the end of the pin portion 205b. In the embodiment of FIG. 1, the circular base end 205a can be mechanically fixed to the inside of the housing 201 (by press fit assembly, or welding assembly).

For a person skilled in the art it is understood that a different number of beams 118 can be used so long as they can hold a part of the conductive rod 205b.

In the assembled condition, the end face 186 of the piston head 180 may abut or substantially abut the end face 116 of the clip 110 so that the clip 110 can be axially supported within the piston body 150. Annular face 182 of the piston head 180 may also abut an end face 152 of the piston body 150. A gap between both faces 182 and 152 can be sealed with a certain material. In a preferable embodiment, the piston head 180 and the piston body 150 may has substantially identical diameters so that there is no step at the connecting portion of the two parts.

The clip 110 is configured to be inserted into the piston body 150 along the direction B from the piston head 180, which is in the opposite direction to a standard direction. The advantage of inserting the clip 100 in this direction is that the beams 118 of the clip 110 make contact with the rod deeper into the spring pin assembly, thus providing reliable contact in a shorter height (a length along the front-rear direction in drawings). In addition, inserting and pushing the clip 110 from the side where the piston head will be assembled provides the ability to push on end face 116, avoiding any stress on the beams 118.

The reverse insertion has been made possible by the assembly construction. If the piston body 150 is not a separate part, the clip 110 cannot be inserted without damaging the beams 118. The present embodiment allows the assembler to push on the strong end of the clip 110.

In this embodiment, the outer surface of the tubular part 183 111 is secured to the inner surface of the receiving portion 158 of the piston body 150. Preferably, the tubular part 183 is ultrasonic welded to a part of the piston body 150 to thereby form a circumferential welded area W. The welded area W is extending along the axial direction. The welded area W preferably presents a length Lm in axial direction less than 0.5 mm.

In addition, such ultrasonic welded area W is typically free of Heat Affected Zone, or comprises a very limited Heat Affected Zone having a thickness lower than 0.01 mm as temperature during ultrasonic welding remains low. The welded area W is also typically free of added metal.

Ultrasonic welding permits at least one of the followings: a better gold platting (especially at the bottom of holes) as the temperature does not increase during the ultrasonic welding, a better behavior in respect to the radiofrequencies, a better resistance to heat and aging due to the fact that the connector is monobloc. Further, ultrasonic welding permits that thin parts can be welded to each other. Thus, wall thickness Lw at a position where both parts are ultrasonic welded may be less than 0.25 mm, preferably less than 0.20 mm, and more preferably less than 0.15 mm.

In one embodiment, the annular face 182 of the piston head 180 (FIG. 2) can also be ultrasonically welded to the face 152 of the piston body 150.

Other technologies to join two parts includes the followings; press-fitting, crimping, latching, brazing, soldering, conductive adhesives and other welding processes. However, in press-fitting, the problem can be high force and thick walls required. In crimping, the problem can be mechanical deformation and potential plating damage. In brazing, the problem can be expensive, complicated, slow process, heat damaging the plating. In soldering, the problem can be part geometry and size, heat damaging the plating. In conductive adhesives, the problem can be low mechanical strength. In the other welding processes, the problem can be damage to plating.

According to the embodiment, the piston assembly 100 consists of separate and simple to manufacture parts; the piston body 150 and the piston head 180. This enable that the clip 110 can be inserted into the piston body 150 along the direction B, thus damaging to the beams 118 can be prevented. In addition, due to the fact that the piston head 180 is ultrasonically welded to the piston body 150, compact welded area W with sufficient reliability can be obtained.

In the present invention, both a plane rod and a hollow rod can be used for the piston head 180. In the above embodiment the piston head 180 is a male member and the piston body 150 is a female member, however, the opposite design can be used.

REFERENCE NUMERALS 100 piston assembly
111 base end
116 end face
117 clipping portion
118 flexible beam
150 piston body
151 tubular wall
153 flange
156 annular face
158 receiving portion
180 piston head
183 tubular part
201 housing
205 conductive rod
205a base end
205b pin portion
S coil spring

The invention claimed is:

1. A piston assembly for a spring-loaded contact, comprising:
  a piston body, arranged to be received into a guiding cylinder of the spring-loaded contact,
  a piston head, with a contacting surface arranged for contacting an external part, and
  a clip configured to support an end of a conductive portion of the spring-loaded contact,
  wherein an end face of the piston head abuts an end face of the clip, such that the clip is axially supported within the piston body;
  wherein the piston body comprises a through hole, the clip being disposed within the through hole,
  wherein the piston head is attached to the piston body by an ultrasonic welded portion, and
  wherein the spring-loaded contact further comprises a coil spring configured to move the piston assembly within the guiding cylinder.

2. The piston assembly according to claim 1, wherein the clip comprises:
  a flexible contacting end arranged to mate with the end of the conductive portion of the spring-loaded contact,
  a base end, opposite to the flexible contacting end,
  wherein the base end is disposed within the through hole, on a piston head side.

3. The piston assembly according to claim 2, wherein the base end comprises a tubular wall arranged to withstand a press fit force applied to the clip to insert the clip into the through hole.

4. The piston assembly according to claim 1, wherein the clip comprises a clipping portion opposite to the piston head.

5. The piston assembly according to claim 1, wherein the at least one of the piston body, the piston head, or the clip is plated before the piston head is ultrasonically welded to the piston body as a welded portion.

6. The piston assembly according to claim 1, wherein the welded portion is free of Heat Affected Zone, or wherein the welded portion is comprising a Heat Affected Zone having a thickness lower than 0.01 mm.

7. The piston assembly according to claim 2, wherein a wall thickness (Lw) at a position where the piston body and the piston head is welded is less than 0.2 mm.

8. The piston assembly according to claim 2, wherein a mating length (Lm) along a longitudinal axis of the piston assembly at a position where the piston head is mating with the piston body is less than 0.5 mm.

9. A spring-loaded contact, comprising;
  the piston assembly according to claim 1, and
  a housing.

10. The spring-loaded contact according to claim 9, wherein the end of the conductive portion comprises a pin portion for mating with the clip.

11. The spring-loaded contact according to claim 9, wherein the conductive portion comprises a base portion for connecting an electronic or electric circuit.

12. The piston assembly according to claim 1, wherein the piston body comprises a flange that is pushed by the coil spring until the flange abuts an end wall of the guiding cylinder.

* * * * *